(12) United States Patent
Hu

(10) Patent No.: US 6,633,191 B2
(45) Date of Patent: Oct. 14, 2003

(54) CLOCK BUFFER WITH DC OFFSET SUPPRESSION

(75) Inventor: Yaqi Hu, Plano, TX (US)

(73) Assignee: Vitesse Semiconductor Corporation, Camarillo, CA (US)

(*) Notice: Subject to any disclaimer, the term of this patent is extended or adjusted under 35 U.S.C. 154(b) by 0 days.

(21) Appl. No.: 09/865,008

(22) Filed: May 24, 2001

(65) Prior Publication Data

US 2002/0105369 A1 Aug. 8, 2002

Related U.S. Application Data

(60) Provisional application No. 60/266,682, filed on Feb. 5, 2001.

(51) Int. Cl.[7] .................................................. H03L 5/08
(52) U.S. Cl. ...................... 327/323; 327/312; 327/563; 330/260; 330/282
(58) Field of Search .................. 327/306, 309–312, 327/316, 319, 323, 332, 331, 333, 563, 243, 246; 330/252–254, 259, 260, 277, 278, 282, 291–294

(56) References Cited

U.S. PATENT DOCUMENTS

| | | | |
|---|---|---|---|
| 4,276,485 A | 6/1981 | Rydval | 326/105 |
| 4,437,171 A | 3/1984 | Hudson et al. | 365/177 |
| 4,739,198 A | 4/1988 | Maruyama | 327/52 |
| 4,754,171 A | 6/1988 | Dasai et al. | 326/126 |
| 4,970,406 A * | 11/1990 | Fitzpatrick et al. | 327/198 |
| 4,999,520 A | 3/1991 | Usami et al. | 326/18 |
| 5,057,701 A | 10/1991 | Miller, Jr. | 327/292 |
| 5,059,829 A * | 10/1991 | Flannagan et al. | 326/17 |
| 5,274,284 A | 12/1993 | Krenik et al. | 326/62 |
| 5,313,120 A * | 5/1994 | Pelley, III | 326/62 |
| 5,376,898 A | 12/1994 | Tanaka et al. | 330/253 |
| 5,512,853 A | 4/1996 | Ueno et al. | 327/333 |
| 5,602,498 A | 2/1997 | Satoh et al. | 326/126 |
| 5,652,545 A | 7/1997 | Miyashita et al. | 330/269 |
| 5,754,062 A | 5/1998 | Satoh et al. | 326/126 |
| 5,796,278 A | 8/1998 | Osborn et al. | 327/108 |
| 5,818,278 A | 10/1998 | Yamamoto et al. | 327/333 |
| 5,903,175 A * | 5/1999 | Miyashita | 327/199 |
| 6,011,436 A | 1/2000 | Koike | 330/253 |
| 6,018,261 A | 1/2000 | Alford et al. | 327/307 |
| 6,023,181 A | 2/2000 | Penny et al. | 327/291 |
| 6,118,333 A | 9/2000 | Oda | 327/560 |
| 6,160,422 A | 12/2000 | Huang | 326/95 |
| 6,181,182 B1 | 1/2001 | Stotz et al. | 327/256 |
| 6,208,177 B1 | 3/2001 | Knoedl, Jr. | 327/108 |
| 6,211,722 B1 | 4/2001 | Mattia et al. | 327/407 |

FOREIGN PATENT DOCUMENTS

| | | |
|---|---|---|
| JP | 02 071612 | 3/1990 |
| WO | WO 01/03300 | 1/2001 |

OTHER PUBLICATIONS

Sasaki, et al., "A New Emitter–Follower Circuit for High–Speed and Low–Power ECL," IEICE Trans. Electron vol. E78–C No. 4, pp. 374–379, Apr. 1995.

* cited by examiner

*Primary Examiner*—Minh Nguyen
(74) *Attorney, Agent, or Firm*—Christie, Parker & Hale, LLP

(57) ABSTRACT

A circuit includes a differential amplifier providing a differential signal to a voltage follower. The output of the voltage follower is fed back through resistors to an additional differential amplifier to the respective inputs to the voltage follower. The feedback is negative at low frequencies and less negative or positive about the clock frequency.

18 Claims, 2 Drawing Sheets

# CLOCK BUFFER WITH DC OFFSET SUPPRESSION

CROSS-REFERENCE FOR RELATED APPLICATION

This application claims the benefit of the filing date of U.S. Provisional Patent Application Clock Buffer With DC Offset Suppression, Application No. 60/266,682, filed Feb. 5, 2001, the disclosure of which is incorporated by reference herein.

BACKGROUND OF THE INVENTION

The present invention relates generally to buffer circuits, and more particularly to differential buffers for high frequency clock signals.

Buffer circuits are often utilized in integrated circuits. Buffer circuits provide a variety of functions. These functions include transitioning signals from one voltage level to another, such as near the input or output of a device, presenting a known load to a signal transmitter, such as an input to a cell, or providing increased drive for a signal, particularly signals which must be transmitted over significant distances within an integrated circuit.

Some signals are extensively routed with integrated circuits. An example of such a signal is a clock signal. Clock signals are usually distributed using clock trees throughout relatively large areas within integrated circuits. Clock signals are distributed as much of the integrated circuit is synchronously clocked, all using the same clock signal. Clock signals in a clock tree are often sent through buffers separated periodically in space to reduce signal attenuation through transmission. A single clock signal, therefore, may pass through a number of clock buffers.

Differential buffers are often used to buffer high speed clock signals. Many noise sources are common-mode in nature, and differential buffers have good common-mode rejection. In addition, differential buffers often provide improved switching performance, in part because differential buffers may have smaller noise margins allowing for small voltage swings between signal levels.

Preferably, the output signals of a differential buffer do not exhibit drift from one another. When used with a clock signal, for example, the output signals should have the same DC level. Generally, however, resistors and transistors in a differential buffer tend to be slightly mismatched. These mismatches may result in some non-common-mode signal drift. Moreover, differential buffers are often low-pass circuits. Any non-common-mode signal drift, therefore, is likely to be amplified to a greater extent than signal components about a clock frequency. This may result in duty cycle distortion or even effective loss of the clock signal, particularly for high frequency clock signals and long clock buffer trees.

SUMMARY OF THE INVENTION

The present invention provides a clock buffer with dc offset suppression. In one embodiment the invention comprises a differential amplifier, a voltage follower, and a negative feedback circuit. The differential amplifier receives a differential signal and generates an intermediate differential output signal. The voltage follower receives intermediate differential output signal and generates a differential output. The negative feedback circuit receives the differential output and provides negative feedback for the intermediate differential output signal. In one embodiment, the negative feedback circuit comprises a further differential amplifier and two resistive elements. The differential amplifier comprises a first pair of transistors, each receiving one of the differential outputs at their gates after the differential outputs are passed through one of the two resistive elements. In a still further embodiment, the buffer includes a steering circuit coupled to the differential output, the steering circuit steering current from the output of the differential output being pulled low.

In a further embodiment, the invention comprises a differential clock buffer. The differential clock buffer includes an input differential amplifier receiving an input differential clock signal and forming an intermediate differential signal. A differential signal driver receives the intermediate signal and provides an output differential clock signal. The invention further includes means for providing feedback to the intermediate signal using the output differential clock signal. In a further embodiment, the means for providing feedback provides greater negative feedback at low frequencies than at frequencies about the frequency of the input differential clock signal, and more particularly positive feedback at frequencies about the frequency of the input clock signal.

In a still further embodiment, the invention comprises a method of buffering differential clock signals. The method includes receiving a differential clock signal, and forming an intermediate differential clock signal using the differential clock signal. The invention further comprises forming an output differential clock signal using the intermediate differential clock signal and providing feedback to the intermediate clock signal.

These and other aspects of the present invention will be more fully appreciated in view of the attached figures briefly described below and the following detailed description.

DETAILED DESCRIPTION

Figure 1:
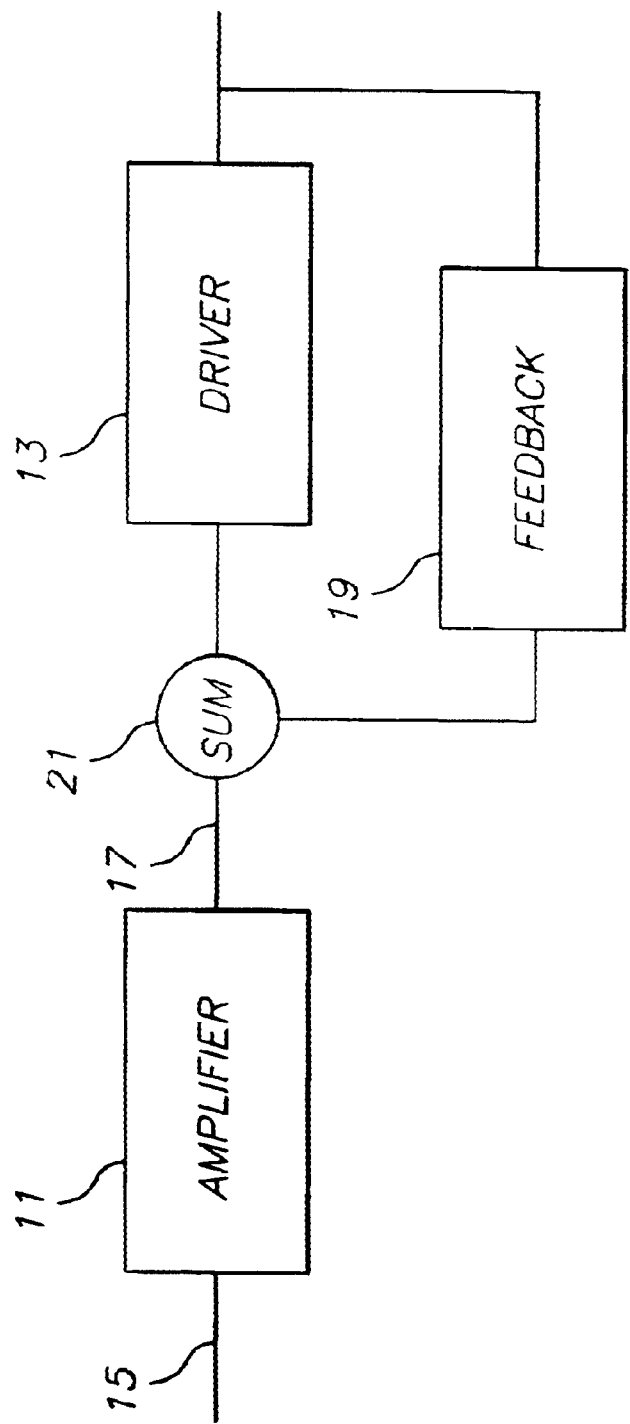
FIG. 1 illustrates a block diagram of a buffer circuit in accordance with aspects of the present invention.

FIG. 1 illustrates a block diagram of a clock buffer circuit in accordance with aspects of the present invention. The clock buffer circuit includes a differential amplifier 11 and a voltage follower 13. A differential input signal 15 is provided to the differential amplifier, which forms an intermediate differential signal 17. The intermediate differential signal is provided to the voltage follower, and the voltage follower forms a differential output signal.

Generally, the differential amplifier receives the differential input signal at gates of transistors, the gates of the transistors sinking relatively little current while effecting more significant changes at the outputs of the transistors. More specifically, the output of differential amplifier is largely based on the differences between the input differential pair, and thereby compensates somewhat for common-mode signal drift. The voltage followers then provide drive capability to the resulting signal. Thus, the differential amplifier and voltage followers are able to receive relatively weak signals and output, or drive, relatively strong signals.

Associated with the differential amplifiers is a gain. At higher frequencies effects such as Miller effect, which increase the effective capacitance of a transistor, will increase the response time of the transistor, resulting in decreased high frequency gain. Accordingly, the portions of the circuit of FIG. 1 described so far tend to introduce signal gain primarily for low frequency and dc components of the signal.

In accordance with aspects of the present invention, therefore, negative feedback is provided in the circuit. As illustrated in FIG. 1, the differential output of the voltage followers is provided to a negative feedback block 19. The negative feedback block amplifies the signal, particularly at low frequencies, and provides a feedback signal to a summing node 21 interspersed between the differential amplifier and the voltage follower. The output from the first inverter and the negative feedback block are summed at the summing node to reduce the input to the second inverter block in order to reduce dc gain in the system.

Figure 2:
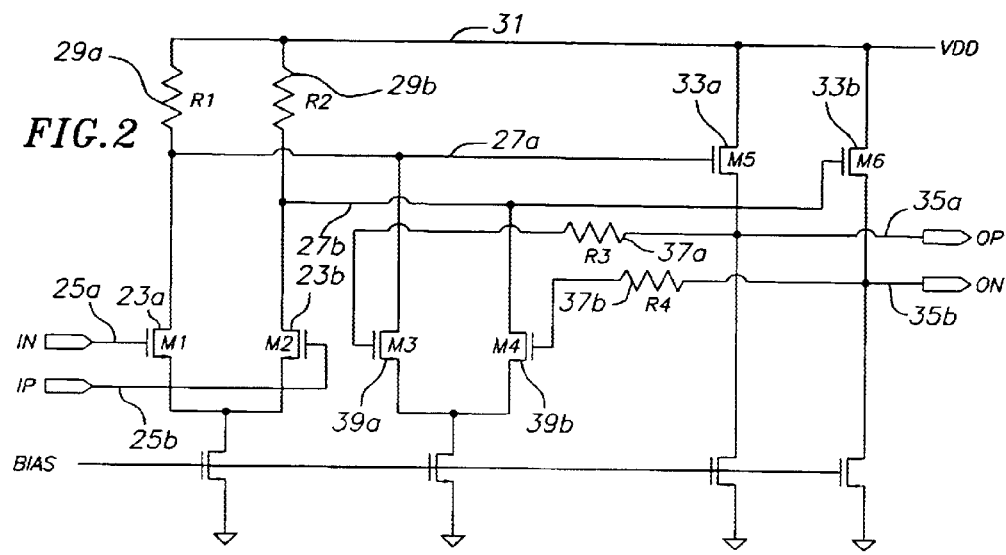
FIG. 2 illustrates a schematic of a clock buffer circuit in accordance with aspects of the present invention.

FIG. 2 illustrates a schematic of a circuit implementing in one embodiment the system of FIG. 1. The circuit of FIG. 2 includes a differential amplifier transistor pair 23a, b. The differential amplifier transistor pair receives a differential input signal 25a, b at gates of the transistors. The differential amplifier transistor pair provides an output signal at the drains of the transistors. In particular, an input signal IN is coupled to one gate of the differential amplifier transistor pair and a complimentary input signal IP is coupled to the other gate of the differential amplifier transistor pair. Differential output signals 27a, b are formed from the drains of the differential amplifier transistors. The drains are also connected through load resistors 29a, b to power 31, thereby converting the drain currents to voltages.

The differential output signals are provided to the gates of voltage follower transistors 33a, b. Outputs 35a, b of the circuit are taken from the sources of the output followers. The outputs of the circuit are also fed back through feedback resistors 37a, b to gates of feedback transistors 39a, b. The feedback transistors have drains coupled to the output of the differential transistors being fed to the voltage followers. More particularly, the gate which is driven by an output signal generated by a first voltage follower has its drain connected to the driving transistor of the opposing voltage follower.

In operation, therefore, a differential input signal applied to the first differential pair results in a differential output signal being produced by the follower transistors. The output signal drives the second differential pair, with the drains of the second differential pair coupled to the drains of the first differential pair, but driven with the complementary signals. The differential pairs therefore oppose one another, resulting in reduced dc gain.

At increased frequencies, however, the transistors of the second differential pair exhibit increased capacitance due to Miller effect. The second differential pair, along with the resistors, therefore introduce a delay in the feedback loop. Moreover, the resistors also help isolate the output line from the capacitance of the feedback transistors. For a periodic signal such as a clock signal, the values of the resistors may be adjusted so as to have the loop delay be approximately one-quarter to one-half of the clock period. In such a situation, the signal at the clock frequency is amplified by positive feedback.

The resistances of the feedback resistors and the input capacitance of the second differential pair form a zero in the transfer function. Since the resistance can be relatively large and the input capacitance is magnified due to the Miller effect, the zero can be at a relatively low frequency. Moreover, at higher frequencies signal attenuation is provided by two poles associated with the circuit. A first pole is formed by the RC circuits formed by the load resistors and the input capacitance of the voltage follower transistors. A second pole is provided by the RC circuit of the output resistance of the voltage follower and the capacitance of the load provided by the output signal lines.

The circuit of FIG. 2, therefore, serves as a bandpass filter. Signal components about the frequency of interest, the clock frequency, are amplified with respect to other frequencies.

Figure 3:
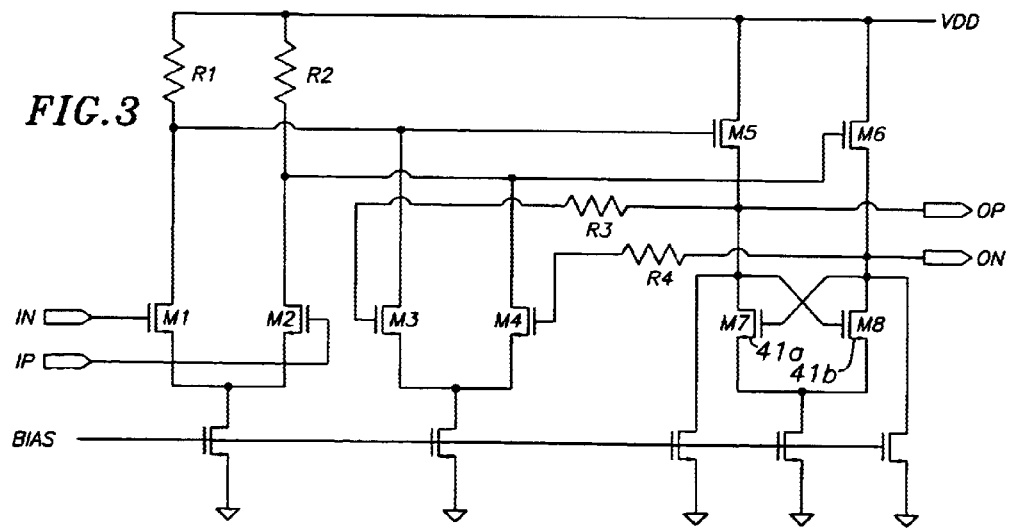
FIG. 3 illustrates a further schematic clock buffer circuit in accordance with aspects of the present invention.

FIG. 3 illustrates a further embodiment of a clock buffer in accordance with aspects of the present invention. The clock buffer FIG. 3 is similar to the clock buffer of FIG. 2. In the clock buffer of FIG. 3, however, a steering circuit comprised of transistors 41a, b is utilized which is composed of a pair of transistors with their drains and gates crosscoupled at the output of the followers. Thus, when one of the differential output signals goes high, the opposite crosscoupled transistor turns on drain current from the output line slewing low. The steering circuit thereby switches the current so as to allow the transistor transitioning an output signal to a high level to provide the output load additional current. Similarly, the output line transitioning low has increased current drained from the output line. This allows the output line going high to charge its capacitance faster, as well as discharging the capacitance of the output line going low faster. The steering circuit therefore increases the peak gain as well as increasing the loop delay necessary for peaking.

The present invention therefore provides a clock buffer circuit. Although the invention is described in certain specific embodiments, it should be recognized that the invention may be practiced other than specifically described. Thus, the invention should be considered to be the claims and their equivalents supported by this disclosure.

What is claimed is:

1. A clock buffer comprising:
    a differential amplifier receiving a periodic differential clock signal and generating an intermediate differential signal;
    a voltage follower receiving the intermediate differential signal and generating a differential clock output;
    a negative feedback circuit receiving the differential clock output and providing negative feedback for the intermediate differential signal, wherein the negative feedback circuit has a feedback loop with a loop delay of approximately one-quarter to one-half the period of the periodic differential clock signal.

2. The buffer of claim 1 wherein the negative feedback circuit comprises a further differential amplifier.

3. The buffer of claim 1 wherein the negative feedback circuit comprises a further differential amplifier and a first pair of resistive elements, the further differential amplifier comprising a first pair of transistors, with a first transistor of the first pair of transistors having its gate coupled by a first resistive element of the first pair of resistive elements to a first clock output of the differential clock output and with a second transistor of the first pair of transistors having its gate coupled by a second resistive element of the first pair of resistive elements to a second clock output of the differential clock output.

4. The buffer of claim 3 wherein the drains of the transistors of the further differential amplifier are coupled to the intermediate differential signal.

5. The buffer of claim 3 wherein the differential amplifier comprises a second pair of transistors, the differential clock signal is applied to the gates of the transistors and the intermediate differential signal is provided at the drains of the transistors.

6. The buffer of claim 5 further comprising a pair of resistors disposed between the drains of the second pair of transistors and power.

7. The buffer of claim 6 further comprising a steering circuit coupled to the differential clock output, the steering circuit steering current from the output of the differential clock output being pulled low, whereby the steering circuit increases a gain and loop delay of the buffer.

8. The buffer of claim 7 wherein the steering circuit comprises a third pair of transistors, with a first transistor of the third pair of transistors having its drain coupled to the first clock output and its gate coupled to the second clock output, with a second transistor of the third pair of transistors having its drain coupled to the second clock output and its gate coupled to the first clock output.

9. The buffer of claim 6 wherein the voltage follower comprises first and second voltage follower transistors, the first voltage follower transistor receiving a first intermediate signal of the intermediate differential signal at its gate and providing the first clock output of the differential clock output at its source, the second voltage follower transistor receiving a second intermediate signal of the intermediate differential signal at its gate and providing the second clock output of the differential clock output at its source.

10. The buffer of claim 8 wherein the differential clock signal is periodic, and wherein the first pair of transistors and the first pair of resistive elements are sized to provide the loop delay of approximately one-quarter to one-half the period of the periodic differential clock signal.

11. A differential clock buffer comprising:
   an input differential amplifier receiving an input differential clock signal at a differential clock frequency and forming an intermediate differential signal;
   a differential signal driver receiving the intermediate differential signal and providing an output differential clock signal; and
   a negative feedback loop having means for providing negative feedback to the intermediate differential signal at frequencies which are lower than the differential clock frequency of the input differential clock signal as a function of resistance of a feedback loop resistor.

12. The differential clock buffer of claim 11 wherein the means for providing negative feedback provides positive feedback at frequencies about the frequency of the input differential clock signal.

13. The differential clock buffer of claim 12 further comprising means for steering current from an output of the differential output signal going low.

14. A method of buffering differential clock signals comprising:
   receiving a differential clock signal;
   forming an intermediate differential clock signal using the differential clock signal;
   forming an output differential clock signal using the intermediate differential clock signal; and
   providing negative feedback to the intermediate differential clock signal using a feedback loop having a feedback loop resistor, the feedback loop having a loop delay a fraction of a clock period of the differential clock signal as a function of resistance of the feedback loop resistor.

15. The method of buffering differential clock signals of claim 14 wherein the feedback is negative feedback.

16. The method of buffering differential clock signals of claim 14 wherein the feedback is negative feedback at frequencies substantially less than the frequency of the differential clock signal.

17. The method of buffering differential clock signals of claim 16 wherein the feedback is positive feedback at frequencies about the frequency of the differential clock signal.

18. A clock buffer circuit comprising:
   a differential amplifier transistor pair receiving a differential input clock signal at gates of the transistors forming the differential amplifier transistor pair, with differential output signals formed from drains of the transistors forming the differential transistor pair;
   voltage follower transistors each receiving at their gates one of the differential output signals, with outputs of the circuit taken from sources of the voltage follower transistors; and
   feedback transistors having gates each receiving one of the outputs of the circuit and drains coupled to the drains of the transistors forming the differential transistor pair, with each feedback transistor having a drain coupled to a gate of the voltage follower transistor providing the output signal provided to a gate of the feedback transistor, wherein resistors are coupled in signal paths between sources of the voltage follower transistors and gates of the feedback transistors.

* * * * *